(12) United States Patent
Watanabe

(10) Patent No.: US 9,068,481 B2
(45) Date of Patent: Jun. 30, 2015

(54) ELECTRONIC COMPONENT ACCOMMODATION MEMBER AND VALVE TIMING CONTROL DEVICE EQUIPPED WITH THE SAME

(71) Applicant: DENSO CORPORATION, Kariya, Aichi-pref. (JP)

(72) Inventor: Kazuyuki Watanabe, Chiryu (JP)

(73) Assignee: DENSO CORPORATION, Kariya (JP)

( * ) Notice: Subject to any disclaimer, the term of this patent is extended or adjusted under 35 U.S.C. 154(b) by 20 days.

(21) Appl. No.: 13/958,712

(22) Filed: Aug. 5, 2013

(65) Prior Publication Data

US 2014/0230763 A1 Aug. 21, 2014

(30) Foreign Application Priority Data

Feb. 18, 2013 (JP) ................................. 2013-029000

(51) Int. Cl.
| | | |
|---|---|---|
| *F01L 1/34* | (2006.01) | |
| *F01L 1/344* | (2006.01) | |
| *H05K 7/20* | (2006.01) | |
| *F01L 1/352* | (2006.01) | |

(52) U.S. Cl.
CPC ............ *F01L 1/344* (2013.01); *H05K 7/20845* (2013.01); *F01L 1/352* (2013.01); *F01L 2820/032* (2013.01)

(58) Field of Classification Search
CPC ..... F01L 1/344; F01L 1/352; F01L 2820/032; H05K 7/20845
USPC .................. 123/90.15, 90.17, 90.38; 464/160
See application file for complete search history.

(56) References Cited

U.S. PATENT DOCUMENTS 7,936,566 B2 5/2011 Shigyo et al.

FOREIGN PATENT DOCUMENTS

| JP | 6-51013 Y2 | 12/1994 |
|---|---|---|
| JP | 9-172750 A | 6/1997 |
| JP | 3921431 B2 | 4/2004 |
| JP | 2005-129861 A | 5/2005 |
| JP | 2005-158909 A | 6/2005 |
| JP | 2007141959 A | 6/2007 |
| JP | 4560477 B2 | 10/2010 |
| JP | 2010-278056 A | 12/2010 |
| JP | 2011-165748 A | 8/2011 |

OTHER PUBLICATIONS

OA issued Feb. 3, 2015 in corresponding JP Application No. 2013-029000 (with English translation).

*Primary Examiner* — Ching Chang

(57) ABSTRACT

An accommodation space formation member forms an accommodation space and a communication hole. The accommodation space accommodates an electronic component. The communication hole communicates the accommodation space with an outside of the accommodation space formation member. A ventilation member is equipped to the communication hole or an opening of the communication hole on a side of the accommodation space. The ventilation member is configured to permit flow of vapor between the accommodation space and the outside and to restrict flow of liquid between the accommodation space and the outside. The accommodation space formation member has an outer wall having a first groove portion, which forms a first groove. The first groove communicates with an opening of the communication hole on the outside.

9 Claims, 7 Drawing Sheets

ELECTRONIC COMPONENT ACCOMMODATION MEMBER AND VALVE TIMING CONTROL DEVICE EQUIPPED WITH THE SAME

CROSS REFERENCE TO RELATED APPLICATION

This application is based on reference Japanese Patent Application No. 2013-29000 filed on Feb. 18, 2013, the disclosure of which is incorporated herein by reference.

TECHNICAL FIELD

The present disclosure relates to an electronic component accommodation member. The present disclosure further relates to a valve timing control device equipped with the electronic component accommodation member.

BACKGROUND

Conventionally, an electromotive valve timing control device, which is configured to control an engine valve timing by utilizing a rotation torque of a motor, is known. In such an electromotive valve timing control device, a planetary rotor connects a driving side rotor, to which torque of a crankshaft is transmitted, with a driven side rotor, which transmits torque to a camshaft. The motor of the valve timing control device manipulates a rotation speed of the planetary rotor relative to the driving side rotor. Thus, the motor of the valve timing control device manipulates the phase of the driven side rotor relative to the driving side rotor, and manipulates an opening-and-closing timing of a valve, which is opened and closed by the camshaft.

Such a valve timing control device may include an electronic component accommodation member to accommodate an electronic component of the control circuit. In such a configuration, the electronic component accommodation member restricts rain water from adhering to a control circuit of a motor drive control unit, which controls the motor. A patent document 1 discloses an electronic component accommodation member, which has an air introduction portion and a ventilation filter. The air introduction portion forms an air introduction passage, which communicates an outside with an accommodation space, in which an electronic component is accommodated. The ventilation filter is equipped to the air introduction passage to permit vapor flow between the outside and the accommodation space. The ventilation filter further restricts liquid flow between the outside and the accommodation space.

[Patent Document 1] Japanese patent No. 3921431

It is noted that, the air introduction portion of the electronic component accommodation member described in the patent document 1 has a labyrinth configuration. Specifically, it is assumable that a water film may be formed on an outer surface of the ventilation filter. Such a water film may blockade vapor flow between the outside and the accommodation space. In consideration of such formation of a water film, the labyrinth configuration restricts water from intruding from the outside into the air introduction passage, not to avoid vapor flow between the outside and the accommodation space. Nevertheless, it is further noted that, manufacturing of the air introduction passage having such a labyrinth configuration may be costly. In the patent document 1, the air introduction portion of the electronic component accommodation member is formed of a resin material. It is further noted that, in a configuration, in which such an air introduction portion is formed of a metallic material, it is difficult to manufacture a labyrinth configuration being in a complicated shape.

SUMMARY

It is an object of the present disclosure to produce an electronic component accommodation member configured to restrict intrusion of liquid into an accommodation space, in which an electronic component is accommodated, and to enable ventilation steadily between the accommodation space and an outside.

According to an aspect of the present disclosure, an electronic component accommodation member comprises an accommodation space formation member forming an accommodation space, in which an electronic component is accommodated, and a communication hole, which communicates the accommodation space with an outside. The electronic component accommodation member further comprises a ventilation member equipped to the communication hole or an opening of the communication hole on a side of the accommodation space, the ventilation member configured to permit flow of vapor between the accommodation space and the outside and to restrict flow of liquid between the accommodation space and the outside. The accommodation space formation member has an outer wall having a first groove portion, which forms a first groove communicating with an opening of the communication hole on an outside.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

Figure 1:
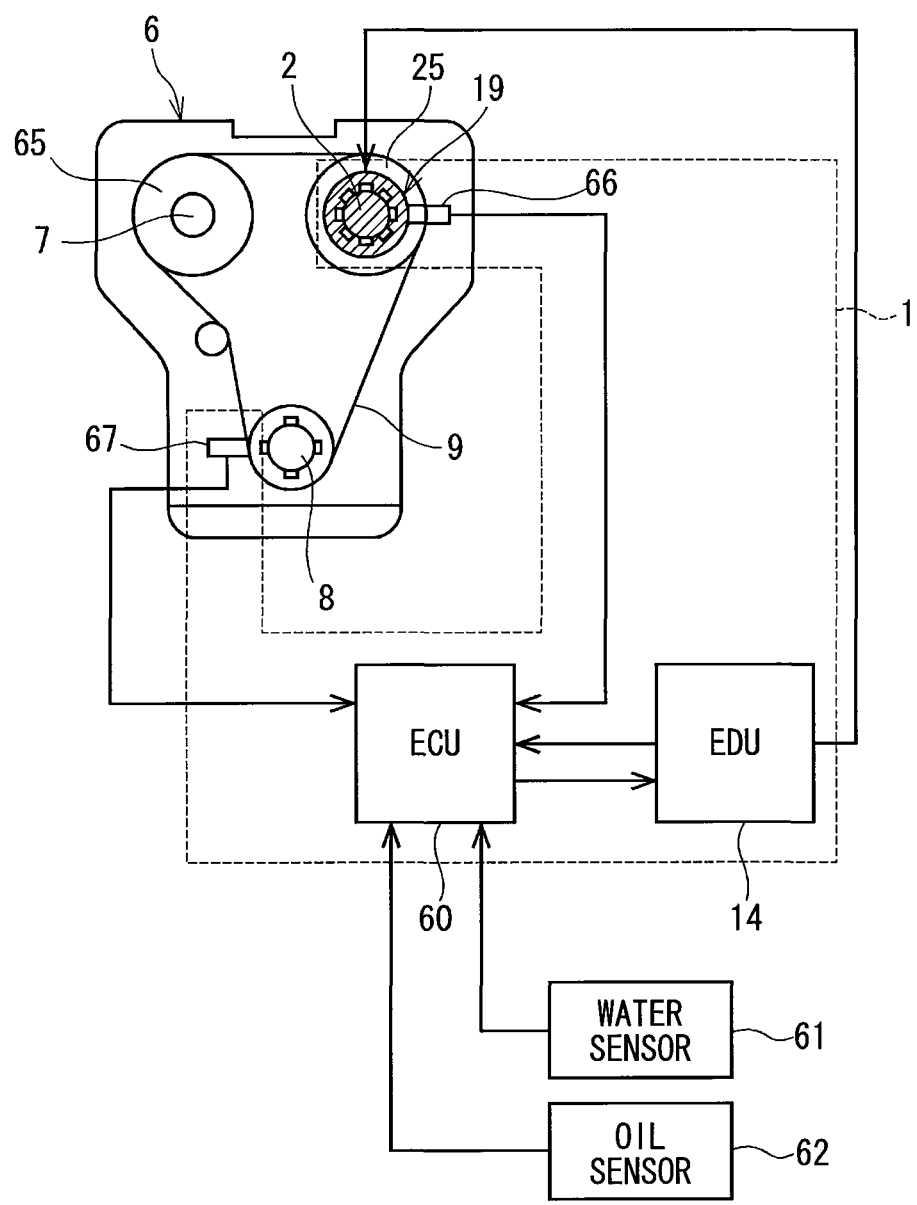
FIG. 1 a diagram showing a valve timing control device, which is equipped with an electronic component accommodation member, and an engine, which is equipped with the valve timing control device, according to a first embodiment of the present disclosure.

Hereafter, multiple embodiment of the present disclosure is described according to a drawing.

(First Embodiment)

FIGS. 1 to 5 show a valve timing control device equipped with an electronic component accommodation member according to the first embodiment of the present disclosure. The valve timing control device 1 is equipped to an internal combustion engine 6 for converting a camshaft phase of an intake-side camshaft (driven shaft) 2, which is relative to a crankshaft (driving shaft) 8, into a predetermined camshaft phase. In the engine 6, the conversion of the camshaft phase causes change in an opening-and-closing timing of an intake valve 55 (valve shown in FIG. 3), which is opened and closed by the intake-side camshaft 2.

In the engine 6, an output power is transmitted from the crankshaft 8 to the intake-side camshaft 2 and the exhaust side cam axis 7, respectively, via a timing belt 9 and sprockets 25 and 65. A cam angle sensor 66 is equipped to a radially outside of the intake-side camshaft 2 for sending a signal according to a rotation angle (camshaft angle) of the intake-side camshaft 2 in synchronism with rotation of the intake-side camshaft 2. A crank angle sensor 67 is equipped to a radially outside of the crankshaft 8 for sending a signal according to a rotation angle (crankshaft angle) of the crankshaft 8 in synchronism with rotation of the crankshaft 8. The ECU 60 receives a signal representing the camshaft angle, which is detected by the cam angle sensor 66, and a signal representing the crankshaft angle, which is detected by the crank angle sensor 67.

The ECU 60 is configured mainly with a microcomputer and is configured to execute various kinds of engine control programs stored in a ROM (storage medium) thereby to control a fuel injection quantity of a fuel injection valve and an ignition timing of a spark plug, according to an engine operation state. The ECU 60 receives, in addition to the signals representing the camshaft angle and the crankshaft angle, a signal representing an oil temperature of lubricating oil, which is for implementing lubrication in the engine 6, and a signal representing a water temperature of cooling water, which is for cooling the engine 6. The oil temperature is detected by the oil temperature sensor 62. The water temperature is detected by a water thermometer 61. The ECU 60 calculates an actual camshaft phase according to the received signals and a target camshaft phase according to an engine operation state. The ECU 60 calculates a target rotation of a motor 10 from the target camshaft phase and sends a signal, which represents the calculated target rotation, to a motor drive control unit (EDU) 14.

The EDU 14 supplies an electric current to the motor 10 (refer to FIG. 2) according to the target rotation, which is sent from the ECU 60. A rotation angle sensor 153 (refer to FIG. 2) is accommodated in the EDU 14 for detecting a rotation state of a motor shaft 15 (refer to FIGS. 2 and 3) of the motor 10. The EDU 14 feeds back the detected rotation state of the motor shaft 15 and/or the like to the ECU 60. The EDU 14 may be one example of a motor electricity supply unit.

Figure 2:
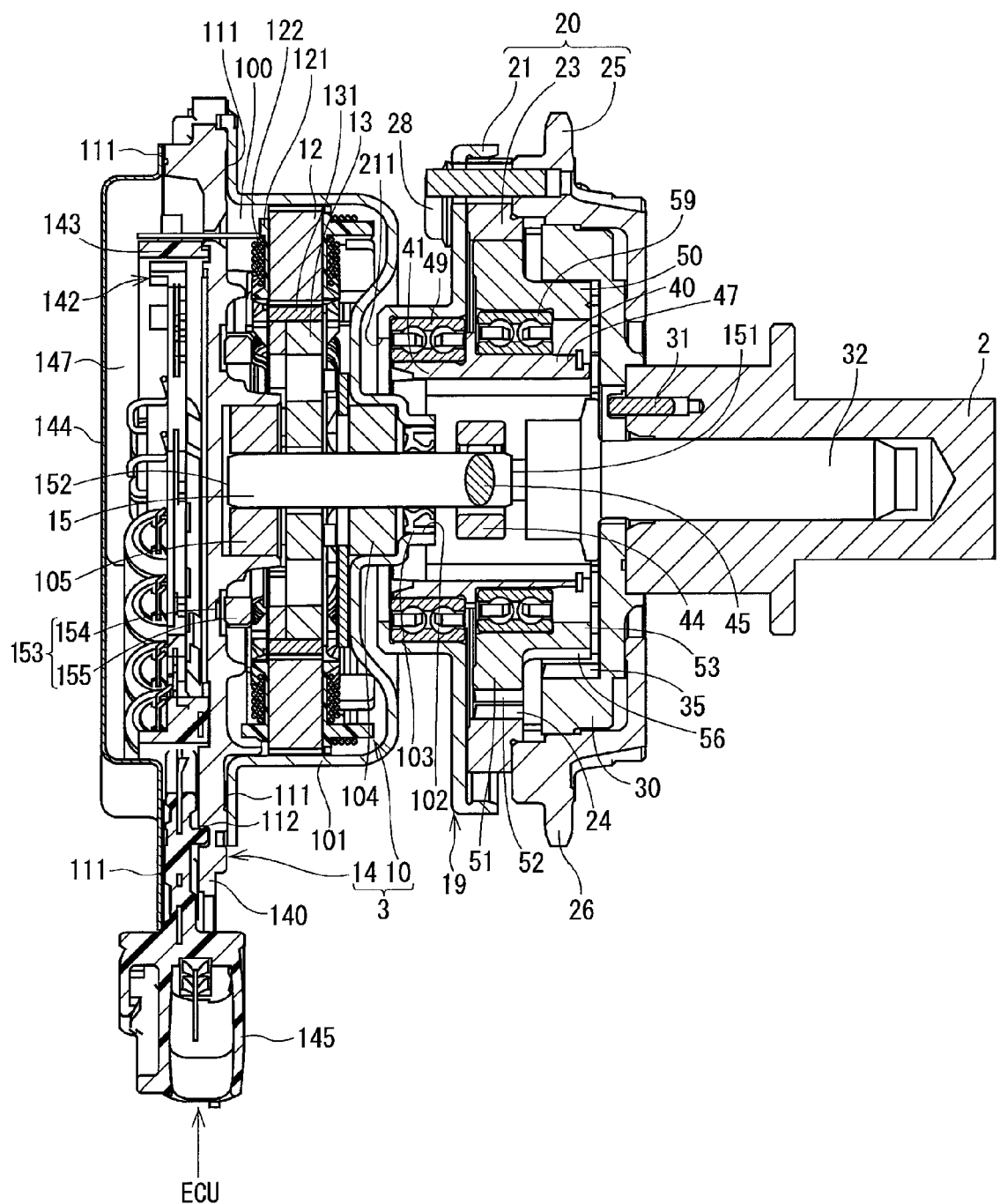
FIG. 2 is a sectional view showing the valve timing control device, which is equipped with the electronic component accommodation member according to the first embodiment of the present disclosure.

FIG. 2 shows a cross section of a motor assembly 3 and a conversion portion 19 of the valve timing control device 1. The motor assembly 3 is configured with the EDU 14, the motor 10, a case 101, a base 140, a cover portion 144, and/or the like. The EDU 14 sends an electric current. The motor 10 generates a rotation torque according to the electric current, which is sent from the EDU 14. The case 101 accommodates the EDU 14 and the motor 10. A conversion portion 19 is one example of a phase control unit. The conversion portion 19 controls the camshaft phase by utilizing a rotation torque of the motor 10.

The EDU 14 is configured with a circuit portion 142, a connector portion 143, a connector 145, and/or the like. The circuit portion 142 is equipped with several kinds of electronic components on its substrate. The connector portion 143 is electrically connected with the motor 10. The connector 145 electrically connects the EDU 14 and the motor 10 with an external components. The circuit portion 142, the terminal portion 143, and/or the like are accommodated in a first accommodation space 147. The first accommodation space 147 is defined by a base 140 and a cover portion 144. The base 140 extends substantially perpendicularly relative to the intake-side camshaft 2. The cover portion 144 is equipped to the base 140 on the opposite side from the conversion portion 19. As shown in FIG. 2, an adhesive 112 is equipped between the base 140 and the terminal portion 143. a seal member 111 is equipped between the base 140 and the cover portion 144. These components 112, 111 restrict intrusion of liquid and vapor into the first accommodation space 147 through the connection between these components. The base 140 and the cover portion 144 may be one example of an accommodation space formation member.

Figure 4:
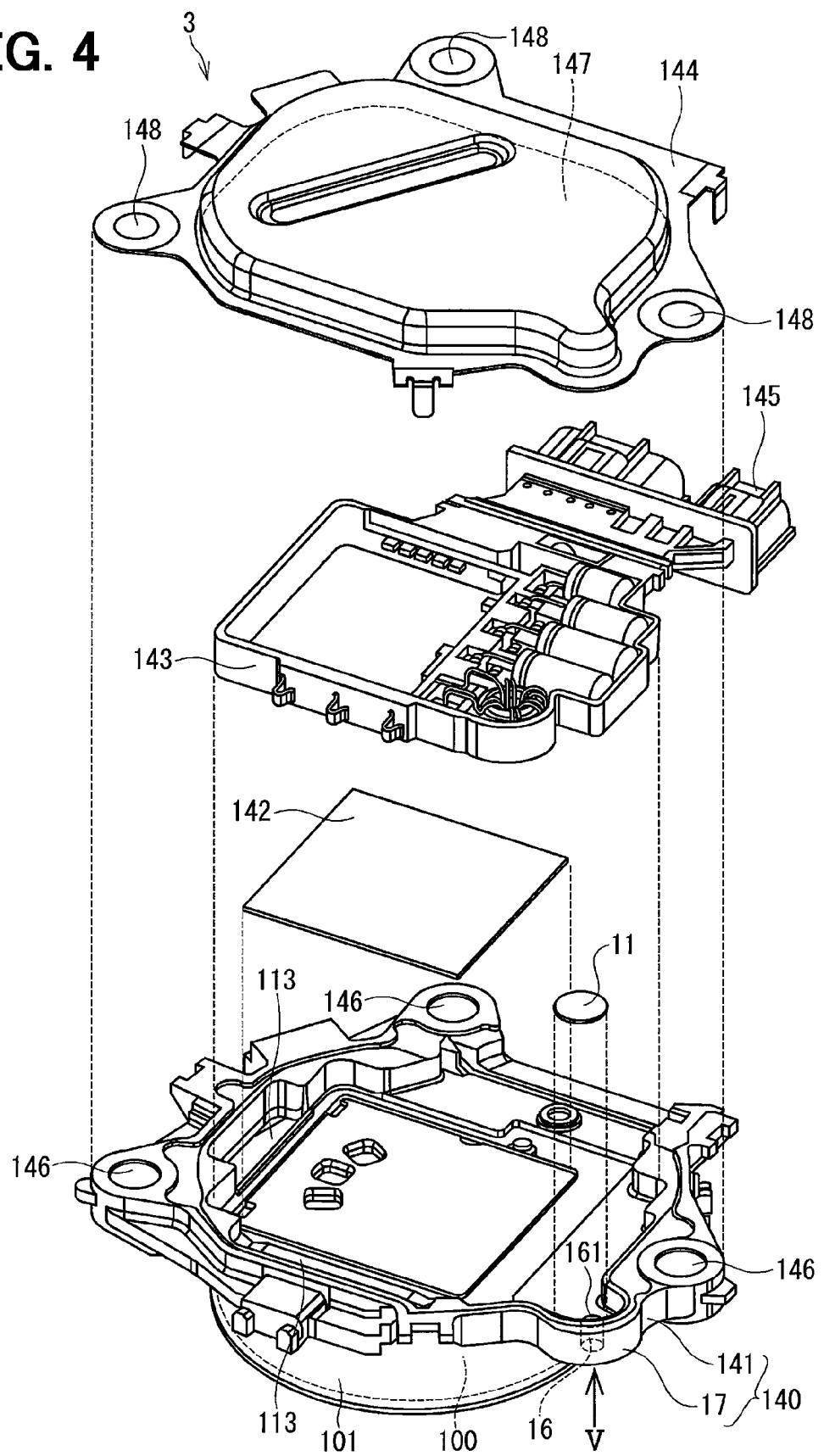
FIG. 4 is an exploded perspective view showing a motor drive control unit of the valve timing control device equipped with the electronic component accommodation member according to the first embodiment of the present disclosure.

The circuit portion 142 is configured with a controller circuit board and a power supply circuit board. The controller circuit board is equipped with a motor rotation angle sensor 153, a custom IC, and/or the like. The motor rotation angle sensor 153 detects the rotation angle of the motor shaft 15. The custom IC controls a rotation speed of the motor shaft 15 and restricts an overcurrent. The power supply circuit board is equipped with a power MOS device and/or the like. The power MOS device controls an amount of electricity supply. The power supply circuit board also functions to dissipate heat generated by the power MOS device. FIG. 4 is an exploded perspective view showing the motor assembly 3. In FIG. 4, these electronic components are omitted, and only the substrate is illustrated. The circuit portion 142 is electrically connected with the motor 10 through the terminal portion 143.

The terminal portion 143 is a resin member, which is substantially in a rectangular tubular shape. The terminal portion 143 is equipped with an electronic component, such as a capacitor. The connector 145 is equipped to a radially outer side of the terminal portion 143. The connector 145 is formed integrally with the terminal portion 143. The connector 145 is located at a notch portion, which is formed in the main body 141 of the base 140, when the terminal portion 143 is attached to the base 140. The connector 145 is used to connect the terminal portion 143 and various electronic components, which are equipped to the circuit portion 142, electrically with the ECU 60, a battery, and the like (none shown) being external devices.

The motor 10 is, for example, an electric brushless motor. The motor 10 includes a stator 12, a rotor 13, and the motor shaft 15. The stator 12, the rotor 13, and/or the like are accommodated in a second accommodation space 100, which is defined by the case 101 and the base 140 of the EDU 14. The motors 10 may be one example of an electronic component. The case 101 may be one example of an accommodation space formation member.

One end 151 of the motor shaft 15 is inserted through an opening 102, which is formed in a bottom of the case 101. An oil seal 103 is equipped between the opening 102 and the motor shaft 15. The oil seal 103 is configured to restrict intrusion of liquid and vapor into the second accommodation space 100. A bearing 104 is equipped to the oil seal 103 on an opposite side from the conversion portion 19. The bearing 104 rotatably supports the motor shaft 15. The other end 152 of the motor shaft 15 is rotatably supported by a bearing 105. The bearing 105 is equipped to the base 140 and located on a side of the conversion portion 19. The bearing 105 is coaxial with the bearing 104. The bearing 104 and 105 are coaxial with each other, such that the motor shaft 15 is supported by the bearing 104 and 105 and enabled to rotate in forward and reverse directions relative to the case 101 and the base 140. A seal member 111 is equipped between the case 101 and the base 140 to seal therebetween, thereby to restrict intrusion of liquid and vapor into the second accommodation space 100.

A bobbin 121 is equipped on an axially outer side of the stator 12. A coil 122 is wound around the bobbin 121. By supplying an electric current to the coil 122, a rotating magnetic field is generated in the stator 12. The rotor 13 is equipped to a radially inner side of the stator 12. The rotor 13 rotates integrally with the motor shaft 15. A magnet 131 is equipped on a radially outer side of the rotor 13, such that its N pole and S pole are alternately arranged. In the present configuration, the rotor 13 receives the rotating magnetic field, which is generated by supplying electricity to the coil 122 of the stator 12, and rotates integrally with the motor shaft 15.

The motor 10 is equipped with a magnet 155 of a motor rotation angle sensor 153, which detects the rotation angle of the motor shaft 15. The motor rotation angle sensor 153 detects the rotation angle of the motor shaft 15 according to the relative position between a hall element 154 and the magnet 155. The hall element 154 is equipped to the base 140 and located on a side of the conversion portion 19.

The conversion portion 19 controls the cam phase with change in the rotation speed of the motor 10. The conversion portion 19 includes a driving side rotor 20, a driven side rotor 30, an eccentric shaft 40, a planetary rotor 50, and/or the like.

The driving side rotor 20 is substantially in a tubular shape to accommodate the driven side rotor 30, the eccentric shaft 40, the planetary rotor 50, and/or the like. The driving side rotor 20 includes a cover member 21, a gear member 23, and a sprocket 25. The cover member 21, the gear member 23, and the sprocket 25 are located in this order from the side of the EDU 14 and are fixed with a bolt 28.

The cover member 21 has an opening 211. The opening 211 is inserted with a part of the case 101 and one end 151 of the motor shaft 15. A bearing 49 is equipped to the cover member 21 to support the eccentric shaft 40 and to enable relative rotation of the eccentric shaft 40. The gear member 23 has a peripheral wall portion, which forms a driving side internal-gear portion 24 on its radially inner side. The driving side internal-gear portion 24 meshes with a driving side external-gear portion 52 of the planetary rotor 50. The sprocket 25 has multiple tooth 26 arranged in its rotative direction. The multiple teeth 26 are projected from a peripheral wall portion of the sprocket 25 to a radially outer side. A timing belt 9 is hung between the teeth 26 of the sprocket 25 and multiple teeth formed on the crankshaft 8. In the present configuration, when the crankshaft 8 rotates to generate a torque and when the present torque is transmitted to the sprocket 25 via the timing belt 9, the driving side rotor 20 rotates in conjunction with the crankshaft 8.

The driven side rotor 30 is formed in a bottomed tubular shape and is coaxial with the driving side rotor 20. The driven side rotor 30 is positioned by the pin 31 in a circumferential direction relative to the intake-side camshaft 2. The driven side rotor 30 is fixed by a center bolt 32 to the intake-side camshaft 2. In the present configuration, the driven side rotor 30 rotates integrally with the intake-side camshaft 2. The driven side rotor 30 is rotatable relative to the driving side rotor 20.

The driven side rotor 30 has a peripheral wall portion, which forms the driven side internal-gear portion 35 on its radially inner side. The inner diameter of the driven side internal-gear portion 35 is less than the inner diameter of the driving side internal-gear portion 24. The driven side internal-gear portion 35 is located on an opposite side from the EDU 14 through the driving side internal-gear portion 24 in its axial direction.

The eccentric shaft 40 is entirely in a tubular shape to have an input portion 41 and an eccentric portion 47. The input portion 41 is located on a side of the EDU 14. The eccentric portion 47 is located on an opposite side from the EDU 14. The eccentric shaft 40 is connected with the motor shaft 15 via a motor joint 44 and a joint pin 45. The input portion 41 is coaxial with the driving side rotor 20 and the driven side rotor 30. The input portion 41 is rotatably supported by the bearing 49 equipped to the cover member 21. In the present configuration, the eccentric shaft 40 is rotatable relative to the driving side rotor 20.

The eccentric portion 47 is eccentric to the input portion 41. Therefore, the eccentric portion 47 is eccentric relative to both the driving side rotor 20 and the driven side rotor 30.

The planetary rotor 50 is located on a radially outer side relative to the eccentric portion 47 of the eccentric shaft 40. A bearing 59 is equipped between the eccentric portion 47 and the planetary rotor 50. In the present configuration, the planetary rotor 50 is supported by the eccentric shaft 40, such that the planetary rotor 50 is enabled to implement a planetary motion in conjunction with rotation of the eccentric shaft 40 relative to the driving side rotor 20. When the planetary rotor 50 implements the planetary motion, the planetary rotor 50 rotates around an eccentric center line of the eccentric portion 47 and simultaneously revolves in the rotative direction of the eccentric shaft 40.

The planetary rotor 50 is entirely in a tubular shape to include a large diameter portion 51 and a small diameter portion 53. The large diameter portion 51 is located on a side of the driving side rotor 20. The small diameter portion 53 is located on a side of the driven side rotor 30. The large diameter portion 51 has the driving side external-gear portion 52 on its radially outer side. The small diameter portion 53 has the driven side external-gear portion 56 on its radially outer side. The driving side external-gear portion 52 is located on a radially inner side of the driving side internal-gear portion 24 to mesh with the driving side internal-gear portion 24. The driven side external-gear portion 56 is located on a radially inner side of the driven side internal-gear portion 35 to mesh with the driven side internal-gear portion 35.

In the configuration described above, the conversion portion 19 transmits a rotation torque of the driving side rotor 20 to the driven side rotor 30. The conversion portion 19 further changes a revolution speed of the planetary rotor 50 relative to the rotation speed of the driving side rotor 20, thereby to control the rotation angle of the driven side rotor 30 relative to the driving side rotor 20. Thus, the conversion portion 19 controls the phase of the intake-side camshaft 2, which rotates integrally with the driven side rotor 30, relative to the crankshaft 8. That is, the conversion portion 19 controls the camshaft phase, thereby to control an opening-and-closing timing of the intake valve 55, which is opened and closed by the intake-side camshaft 2.

Figure 5:
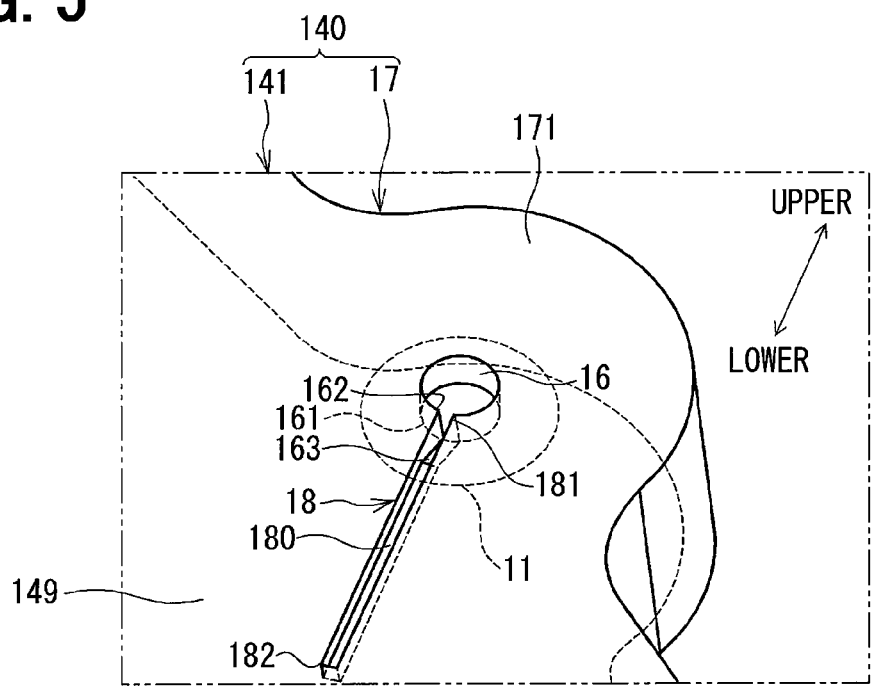
FIG. 5 is an enlarged view showing the base when being viewed along an arrow V in FIG. 4.

The valve timing control device 1 of the first embodiment may have a feature in the configuration of the case 101, the base 140, and the cover portion 144, which accommodate the EDU 14 and the motor 10. Herein, the configuration will be described with reference to FIG. 4 and FIG. 5. FIG. 5 is an enlarged view showing an outer wall of the base 140 when being viewed along the arrow V in FIG. 4. FIG. 5 shows a loading direction of the EDU 14 with an arrow. In FIG. 5, the upper right direction corresponds to an upper side. In FIG. 5, the left lower direction corresponds to a lower side. The case 101, the base 140, and the cover portion 144 may be one example of an accommodation space formation member.

The case 101 is formed of a metallic material, such as aluminum, to be in a bottomed tubular shape. The case 101 is located on an opposite side from the cover 144 through the base 140.

The base 140 is formed of a metallic material, such as aluminum. The base 140 is configured with a main body 141, which is in a disc shape, a ventilation portion 17, and/or the like. The main body 141 has a dented portion on a side of the cover portion 144. The cover portion 144 has a dented portion on a side of the base 140. The dented portion of the main body 141 and the dented portion of the cover portion 144 form a first accommodation space 147. The dented portion of the main body 141 has a bottom surface defining a throughhole 113. The case 101 internally has a second accommodation space 100 on an opposite side from the cover portion 144 through the base 141. The throughhole 113 communicates the second accommodation space 100 with the first accommodation space 147. The main body 141 has an outer periphery having three throughholes 146 as screw holes.

A ventilation portion 17 is formed to extend outward in a radial direction of the main body 141. The ventilation portion 17 has a ventilation throughhole 16. The ventilation throughhole 16 communicates the outside with a dented portion, which is formed in the ventilation portion 17 on a side of the cover portion 144. The dented portion of the ventilation portion 17 on the side of the cover portion 144 is connected with a dented portion of the main body 141. In the present configuration, the ventilation throughhole 16 substantially forms a sole route, which communicates the outside with both the first accommodation space 147 and the second accommodation space 100. The ventilation throughhole 16 is, for example, 4 mm in diameter. The ventilation throughhole 16 may be one example of a communication hole.

As shown in FIG. 5, the outer wall 171 of the ventilation portion 17 on an opposite side from the cover portion 144 has a groove portion 18. The groove portion 18 may be one example of a first groove portion. The groove portion 18 forms a groove 180, which is in a rectangular shape in cross section. The groove 180 may be one example of a first groove. The groove 180 is formed to extend on the lower side when being viewed from the ventilation throughhole 16. The outer wall 171 may be one example of an outer wall of an accommodation space formation member.

One end 181 of the groove portion 18 connects with an edge of the outer opening 162 of the ventilation throughhole 16. In the present configuration, the ventilation throughhole 16 and the groove 18 are communicated with each other. The groove 180 has a tapered bottom surface on the one end 181. Specifically, as shown in FIG. 5, the bottom surface 163 of the groove 180 on the side of the one end 181 is formed to be directed from the outside toward the ventilation filter 11 and to be connected with an edge of an inner opening 161.

The groove portion 18 has another end 182, which is located at a position distant from the ventilation throughhole 16. The other end 182 is located, for example, on the outer wall 149 of the main body 141. The volume of the groove 180 is formed to be larger than the volume of the ventilation throughhole 16. For example, in a case where the diameter of the ventilation throughhole 16 is 4 mm, the width of the groove 180 is, for example, about 1 mm. The outer wall 149 may be one example of an outer wall of the accommodation space formation member.

The ventilation filter 11 is water repellent and is configured to pass vapor therethrough and does not pass liquid therethrough. The ventilation filter 11 may be one example of a ventilation member. The ventilation filter 11 is equipped to an edge of the inner opening 161 of the ventilation throughhole 16. In the present configuration, the ventilation filter 11 restricts water in the ventilation throughhole 16 from intruding thereinto. In addition, the ventilation filter 11 further causes pressure in the first accommodation space 147 to be constant at substantially the same pressure as outside the EDU 14. The inner opening 161 may be one example of an opening of the communication hole on a side of the accommodation space.

The cover portion 144 is, for example, formed of a metallic material and is substantially in a disc shape. The cover portion 144 on a side of a base 140 is formed in a dented shape to form the first accommodation space 147 together with the base 140. The cover portion 144 has an outer periphery having three throughholes 148 as screw holes.

Subsequently, a manufacturing method of the motor assembly 3 for the valve timing control device 1 will be described with reference to FIG. 4. First, the ventilation filter 11 is mounted to the ventilation portion 17 of the base 140 on a side of the first accommodation space 147. The ventilation filter 11 has an adhesive film adhered to an edge of the inner opening 161 of the ventilation throughhole 16. After the ventilation filter 11 is adhered to the base 140, a test equipment is set to an edge of the outer opening 162 of the ventilation throughhole 16. Thereafter, a first ventilation examination is implemented. The present first ventilation examination is implemented to examine a ventilation characteristic of the ventilation filter 11.

Subsequently, the base 140, which is mounted with the ventilation filter 11, is attached to the circuit portion 142. Thereafter, the terminal portion 143 and the connector 145 are attached to each other. Subsequently, a surface of the circuit portion 142 is sealed with a gel-like material. Thus, even when condensate water is caused due to change in the temperature in the first accommodation space 147 and the second accommodation space 100, the present configuration restricts such condensate water from adhering to an electronic component.

Subsequently, the base 140, which is mounted with the circuit portion 142 and/or the like, the motor 10, and the case 101 are attached to each other. At this time, various electronic components, which are mounted to the circuit portion 142, are electrically connected with the motor 10 via the terminal portion 143.

Subsequently, the cover portion 144 is attached to the base 140. Finally, the test equipment is set to the edge of the outer opening 162 of the ventilation throughhole 16, and the ventilation examination for the second time is implemented. The ventilation examination for the second time is implemented to examine airtightness of the first accommodation space 147 and the second accommodation space 100. In such a way, the motor assembly 3 is manufactured.

Figure 3:
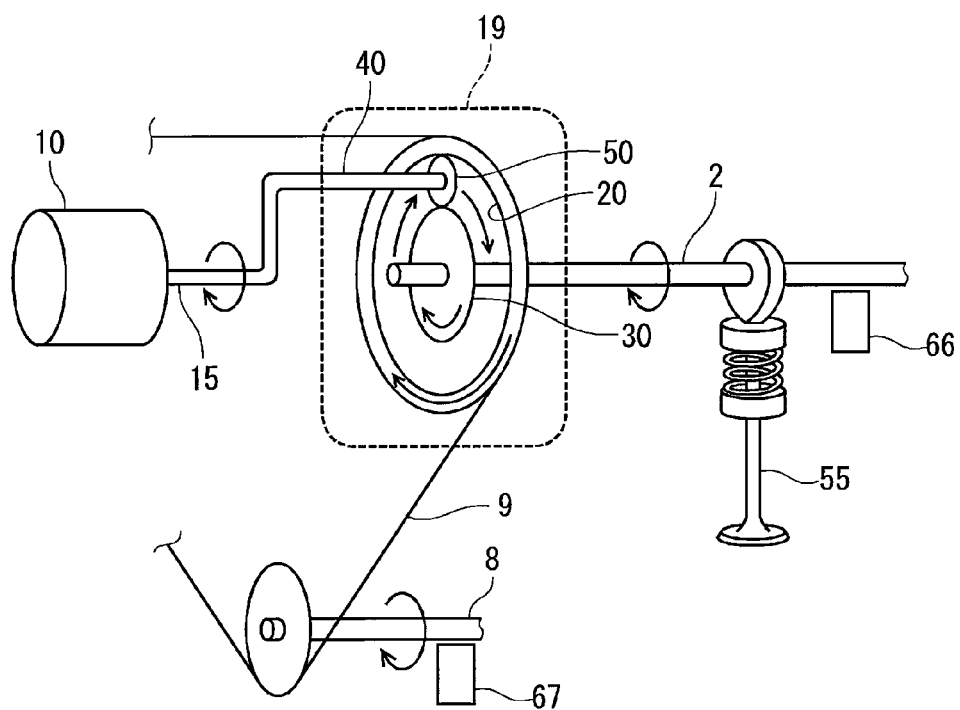
FIG. 3 is a schematic diagram showing the valve timing control device equipped with the electronic component accommodation member according to the first embodiment of the present disclosure.

Subsequently, an operation of the conversion unit 19 of the valve timing control device 1 will be described with reference to FIG. 3.

In the conversion unit 19, the driving side rotor 20, the driven side rotor 30, and the planetary rotor 50 are configured to drive the intake-side camshaft 2 at a rotation speed, which is substantially ½ of a rotation speed of the crankshaft 8. More specifically, the conversion unit 19 controls the rotation speed of the motor 10 at a rotation speed, which is ½ of the rotation speed of the crankshaft 8, thereby to control the opening-and-closing timing of the intake valve 55.

In order to maintain the opening-and-closing timing of the intake valve 55 at the present timing, the rotation speed of the motor 10 is coincided with the rotation speed of the driving side rotor 20. In this way, the revolution speed of the planetary rotor 50 is coincided with the rotation speed of the driving side rotor 20. Thus, the camshaft phase becomes constant, and the opening-and-closing timing of the intake valve 55 is maintained in conjunction with rotation of the intake-side camshaft 2.

When the opening-and-closing timing of the intake valve 55 is changed from a constant timing, the rotation speed of the motor 10 is changed relative to the rotation speed of the driving side rotor 20. In this way, the revolution speed of the planetary rotor 50 is changed relative to the rotation speed of the driving side rotor 20. Thus, the camshaft phase is changed, and the opening-and-closing timing of the intake valve 55 is changed.

In order to advance the opening-and-closing timing of the intake valve 55, the rotation speed of the motor 10 is set to be faster than the rotation speed of the driving side rotor 20. In this way, the revolution speed of the planetary rotor 50 is set to be faster than the rotation speed of the driving side rotor 20. In this way, the rotation angle of the driven side rotor 30 is advanced relative to the driving side rotor 20. Thus, the opening-and-closing timing of the intake valve 55 is advanced.

In order to retard the opening-and-closing timing of the intake valve 55, the rotation speed of the motor 10 is set to be slower than the rotation speed of the driving side rotor 20, or the motor 10 is rotated in a reverse direction relative to the driving side rotor 20. In this way, the revolution speed of the planetary rotor 50 is delayed relative to the rotation speed of the driving side rotor 20, or the planetary rotor 50 is rotated in the reverse direction relative to the driving side rotor 20. In this way, the rotation phase of the driven side rotor 30 is retarded relative to the driving side rotor 20. Thus, the opening-and-closing timing of the intake valve 55 is retarded.

The motor assembly of the valve timing control device is directly equipped to the engine. Therefore, temperature of the motor assembly may largely vary in a specific operating condition. More specifically, for example, when a vehicle, which is equipped with the valve timing control device, climbs along a slope, temperature of its EDU increases to excessively high temperature such as 100 degrees Celsius. Furthermore, it is assumed a condition where the vehicle including its engine is washed with water at a temperature about 0 degree Celsius, in an environment at an atmosphere temperature about 0 degrees Celsius. In such a case, the motor assembly decreases in temperature rapidly from the high temperature about 100 degrees Celsius to a low temperature about 0 degrees Celsius. In such a case, air in the first accommodation space and the second accommodation space is expanded or contracted according to the change in temperature. Therefore, in the motor assembly, air is exchanged between the accommodation space, which includes the first accommodation space and the second accommodation space, and the outside through the ventilation throughhole. Nevertheless, it is noted that, when the motor assembly is splashed with water, the splashed water may intrude into the ventilation throughhole. The ventilation filter does not pass liquid therethrough. The ventilation throughhole of the ventilation filter may be relatively small in its inner diameter. Therefore, the ventilation filter may form a water film on its outer surface due to surface tension. It is assumable that a water film adheres to the outer surface of the ventilation filter. Even in such a case, air can flow to the outside from the first accommodation space and the second accommodation space. Nevertheless, in such a case, air cannot flow from the outside into the first accommodation space and the second accommodation space.

The motor assembly 3 of the valve timing control device 1 is equipped with the electronic component accommodation member according to the first embodiment. The motor assembly 3 has the groove portion 18 defining the groove 180, which communicates with the ventilation throughhole 16, on the outer walls 149 and 171 of the base 140. When a water film is formed on the outer surface of the ventilation filter 11, the water, which constitutes the water film on the ventilation filter 11, moves into the groove 180 due to its capillary phenomenon. In this way, the water film on the ventilation filter 11 can be removed. Thus, ventilation can be implemented steadily between the outside and the accommodation space, which includes the first accommodation space 147 and the second accommodation space 100, through the ventilation filter 11.

In addition, the groove portion 18 is formed on the lower side relative to the ventilation throughhole 16. In the present configuration, water of the water film on the ventilation filter 11 moves to the groove 180 due to application of gravity force. Therefore, water of the water film on the ventilation filter 11 can be removed easily.

In addition, the volume of the groove 180 is formed to be larger than the volume of the ventilation throughhole 16. In the present configuration, water, which accumulates in the ventilation throughhole 16, can be entirely moved into the groove 180. Therefore, water of the water film on the ventilation filter 11 can be steadily removed.

In addition, the groove 180 is formed in the one end 181 of the groove portion 18. The bottom surface 163 of the groove 180 is formed in a tapered shape extending toward the first accommodation space 147 to be connected with the edge of the inner opening 161 of the ventilation throughhole 16. In the present configuration, even when a thin water film is formed on the ventilation filter 11, such a thin water film can be moved into the groove 180. Therefore, water of the water film on the ventilation filter 11 can be steadily removed.

(Second Embodiment)

Figure 6:
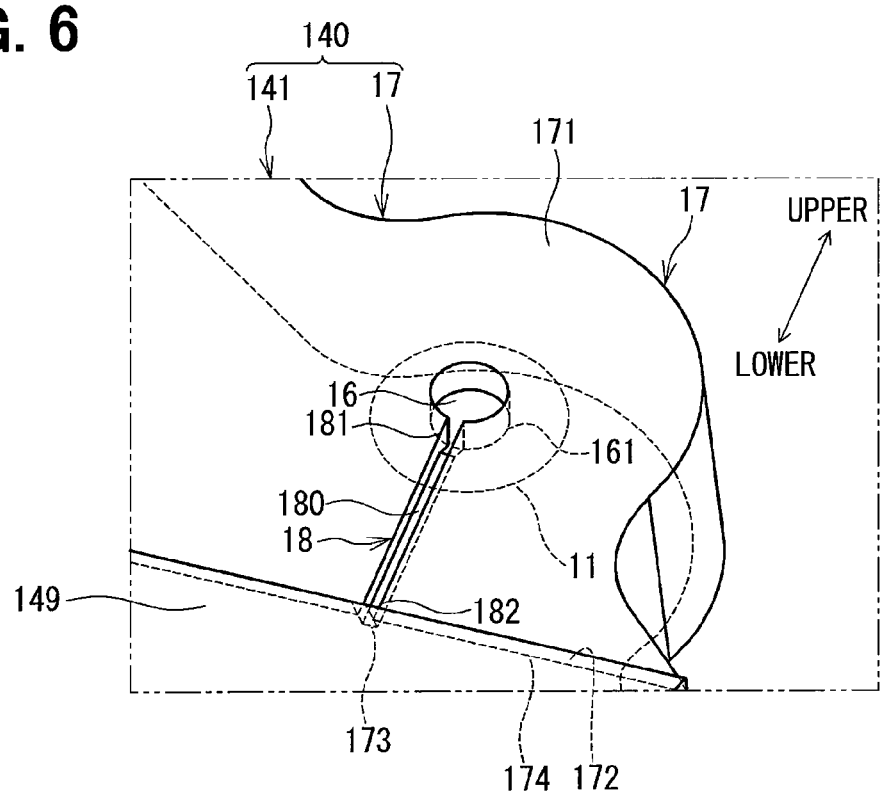
FIG. 6 is an enlarged view showing a main portion of a motor drive control unit of a valve timing control device, which is equipped with an electronic component accommodation member according to a second embodiment of the present disclosure.

Subsequently, a valve timing control device, which is equipped with an electronic component accommodation member according to the second embodiment of the present disclosure, will be described with reference to FIG. 6. The second embodiment differs from the first embodiment in that the groove portion connects to a stepped surface.

In the valve timing control device equipped with the electronic component accommodation member according to the second embodiment, the groove portion 18 connects with a stepped surface 172. The groove portion 18 has the groove 180, which communicates with the ventilation throughhole 16. As shown in FIG. 6, the stepped surface 172 is formed on the outer wall 149 of the main body 141. The stepped surface 172 connects with the other end 182 of the groove portion 18. In the valve timing control device of the second embodiment, the stepped surface 172 is formed on the upper side.

In the valve timing control device equipped with the electronic component accommodation member according to the second embodiment, water of the water film formed on the ventilation filter 11 moves into the groove 180. After water moves from the one end 181 toward the other end 182 along the groove 180, the water reaches a connection portion 173, at which the groove portion 18 connects with the stepped surface 172. The water moves onto an intersection 174 between the stepped surface 172 and the outer wall 171. As shown in FIG. 6, the stepped surface 172 ends at the edge of the outer wall 149. Therefore, the water moving on the intersection 174 further moves away from the base 140 on the edge of the outer wall 149. In this way, water of the water film on the ventilation filter 11 can be easily removed from the ventilation throughhole 16. Therefore, the valve timing control device of the second embodiment produces similar effect to that of the first embodiment.

In addition, in the valve timing control device equipped with the electronic component accommodation member according to the second embodiment, water moves to the groove 180, and the water further moves away from the base 140 at the edge of the outer wall 149. Therefore, regardless of the volume of the groove 180, a large quantity of water can be removed from the ventilation throughhole 16.

(Third Embodiment)

Figure 7:
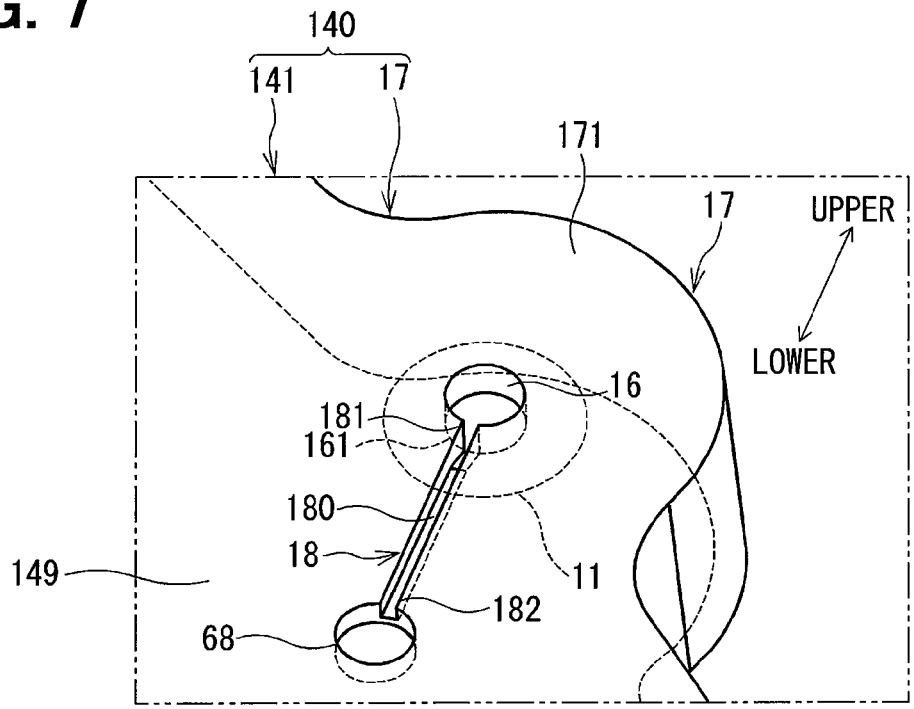
FIG. 7 is an enlarged view showing a main portion of a motor drive control unit of a valve timing control device, which is equipped with an electronic component accommodation member according to a third embodiment of the present disclosure.

Subsequently, a valve timing control device, which is equipped with an electronic component accommodation member according to the third embodiment of the present disclosure, will be described with reference to FIG. 7. The third embodiment differs from the first embodiment in that the groove portion connects with a dented portion.

In the valve timing control device equipped with the electronic component accommodation member according to the third embodiment, the outer wall 149 of the main body 141 has a dented portion 68. As shown in FIG. 7, the dented portion 68 is connected to the other end 182 of the groove portion 18. It may be desirable that a summation of an inner volume of the dented portion 68 and an inner volume of the groove 180 is larger than an inner volume of the ventilation throughhole 16. The dented portion 68 may be one example of a first dented portion.

In the valve timing control device of the third embodiment, water of the water film on the ventilation filter 11 moves from the ventilation throughhole 16 into the groove 180, and thereafter, the water accumulates in the dented portion 68. When a volume of the water, which flows into the dented portion 68, becomes larger than the volume in the dented portion 68, the water overflows from the dented portion 68. Thus, the overflowing water is discharged to the outside of the dented portion 68 along the outer wall 149. In this way, water of the water film on the ventilation filter 11 can be easily removed from the ventilation throughhole 16. Therefore, the valve timing control device of the third embodiment produces a similar effect to that of the first embodiment.

(Fourth Embodiment)

Figure 8:
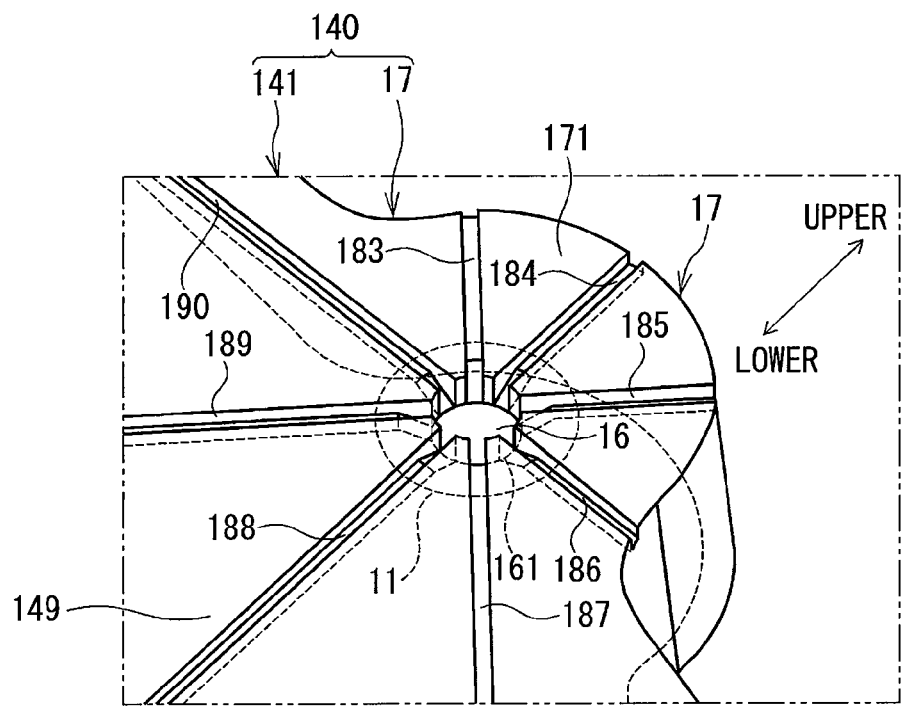
FIG. 8 is an enlarged view showing a main portion of a motor drive control unit of a valve timing control device, which is equipped with an electronic component accommodation member according to a fourth embodiment of the present disclosure.

Subsequently, a valve timing control device, which is equipped with an electronic component accommodation member according to the fourth embodiment of the present disclosure, will be described with reference to FIG. 8. The fourth embodiment differs from the first embodiment in that multiple grooves are formed to communicate with the ventilation throughhole.

In the valve timing control device equipped with an electronic component accommodation member according to the fourth embodiment, grooves 183, 184, 185, 186, 187, 188, 189, and 190 are formed to communicate with the ventilation throughhole 16. As shown in FIG. 8, in the valve timing control device of the fourth embodiment, the eight grooves are formed to communicate with the ventilation throughhole 16. The eight grooves are radially centered around the ventilation throughhole 16.

In the valve timing control device of fourth embodiment, water of the water film on the ventilation filter 11 moves toward the groove 188, which is formed on the lower side relative to the ventilation throughhole 16, among the grooves 183, 184, 185, 186, 187, 188, 189, and 190. When the mount position of the motor assembly 3 is changed, water of the water film on the ventilation filter 11 moves toward a groove, which is formed in a position close to the lower side when being viewed from the ventilation throughhole 16. In this way, in the valve timing control device of the fourth embodiment, water of the water film on the ventilation filter 11 moves to the groove, which is formed in the position close to the lower side, among the multiple grooves, regardless of the mount direction of the motor assembly 3. Thus, the water of the water film can be removed from the ventilation throughhole 16. Therefore, the valve timing control device of the fourth embodiment produces a similar effect to that of the first embodiment, regardless of the mount direction of the EDU 14.

(Fifth Embodiment)

Figure 9:
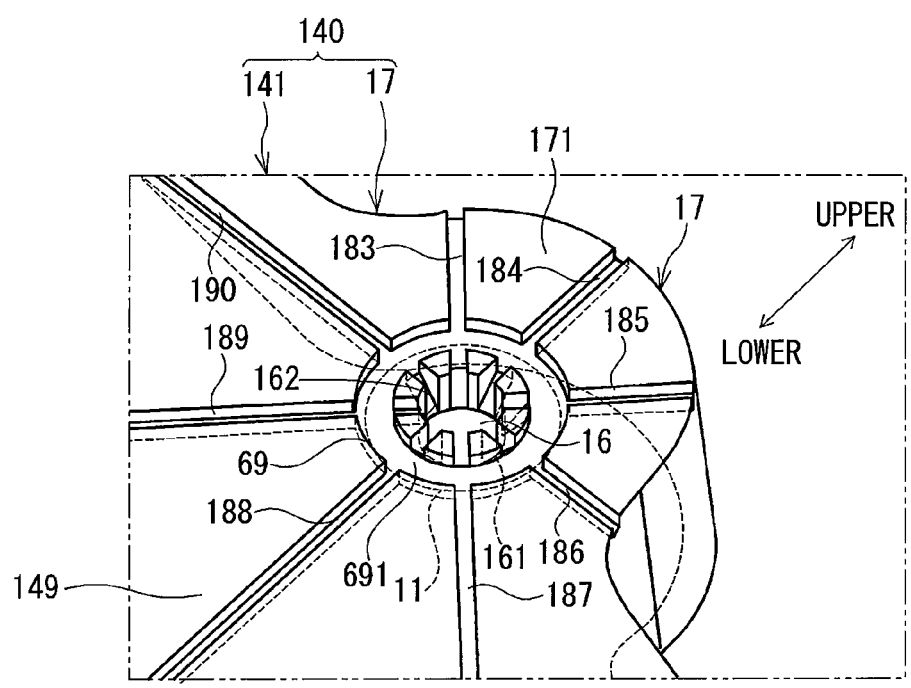
FIG. 9 is an enlarged view showing a main portion of a motor drive control unit of a valve timing control device, which is equipped with an electronic component accommodation member according to a fifth embodiment of the present disclosure.

Subsequently, a valve timing control device equipped with an electronic component accommodation member" according to the fifth embodiment of the present disclosure will be described with reference to FIG. 9. The fifth embodiment differs from the fourth embodiment in that an annular dented portion is formed at a position, which is close to the ventilation throughhole and radially outside of the ventilation throughhole.

In the valve timing control device equipped with the electronic component accommodation member according to the fifth embodiment, an dented portion 69 is formed on the outer wall 171 of the ventilation portion 17 at a position, which is close to the ventilation throughhole 16 on the radially outside of the ventilation throughhole 16. The dented portion 69 may be one example of a second dented portion.

The dented portion 69 is formed to be in an annular shape to surround the outer opening 162 of the ventilation throughhole 16. The inside of the dented portion 69 communicates with the grooves 183, 184, 185, 186, 187, 188, 189, and 190, which connect to the ventilation throughhole 16. Each of the grooves 183, 184, 185, 186, 187, 188, 189, and 190 are formed in a direction to pass through the dented portion 69 and to be away from the ventilation throughhole 16 beyond the dented portion 69, when being viewed from the ventilation throughhole 16.

In a ventilation examination conducted in a manufacturing process of the EDU 14 of the valve timing control device of the fifth embodiment, a test port of a test equipment is made to be in contact with a bottom surface 691 of the dented portion 69. In the present configuration, the shape of the test port need not be matched with the shape of the outer wall 171. Therefore, examination of a ventilation characteristic of the ventilation filter 11 and leak check of the EDU 14 can be easily and steadily conducted. Therefore, the valve timing control device of the fifth embodiment enables to steadily and easily implement examination of the ventilation filter 11 and to produce a similar effect to that of the first embodiment.

(Other Embodiment)

(a) In the above-described embodiments, the electronic component accommodation member forms the accommodation space to accommodate the circuit portion and the resin case of the EDU of the electromotive valve timing control device. It is noted that, the device equipped with the electronic component accommodation member is not limited to the above-described example. The device equipped with the electronic component accommodation member may be configured to accommodate various electronic components.

(b) In the above-described embodiments, the accommodation space, which includes the first accommodation space and the second accommodation space, is defined by the three members including the base, the cover portion, and the case. It is noted that, the member, which defines the accommodation space, is not limited to the above-described examples. The member, which defines the accommodation space, may be configured with a single member, two members, or four or more members. In a case where the member, which defines the accommodation space, is configured with multiple members, such as two members or four or more members, the ventilation throughhole may be formed in at least one of the multiple members. In addition, the ventilation filter may be equipped to the ventilation throughhole. Alternatively, the ventilation filter may be equipped to an opening of the ventilation throughhole on a side of the accommodation space.

(c) In the above-described embodiments, the base is formed with the ventilation throughhole as the communication hole. It is noted that, the member, which is formed with the ventilation throughhole, is not limited to the above-described examples. A ventilation throughhole may be formed in the case or the cover portion. Alternatively, a ventilation throughhole may be formed in all the case, the base, and the cover portion.

(d) In the above-described embodiments, a single ventilation throughhole is formed. It is noted that, the number of the ventilation throughhole is not limited to the above-described examples. Two of more ventilation throughholes may be formed. In this case, a ventilation filter may be equipped to each of the two or more ventilation throughholes, and a groove portion may connect to each of the two or more ventilation throughholes.

(e) In the above-described embodiments, the EDU is equipped directly to the engine. It is noted that, the position, at which the EDU is equipped, is not limited to the above-described examples. The EDU may be equipped to a position away from the engine.

(f) In the above-described embodiments, the groove, which communicates with the ventilation throughhole, is formed to extend toward the lower side, when being viewed from the ventilation throughhole. It is noted that, the direction, in which the groove is formed, is not limited to the above-described examples. The groove may extend toward the upper side. It is further noted that, in a configuration, in which the groove extends toward the lower side, water in the ventilation throughhole may be facilitated to flow into the groove by being applied with gravity force.

(g) In the above-described embodiments, the cross section of the groove is substantially in a rectangular shape. It is noted that, the cross section of the groove is not limited to the above-described examples.

(h) In the above-described fifth embodiment, the dented portion is substantially in an annular shape. It is noted that, the shape of the dented portion is not limited to the above-described examples. The shape of the dented portion may be in another shape configured to be connected with a test port of a test equipment.

(i) In the above-described second embodiment, the groove portion connects with the stepped surface. It is noted that, the portion, to which the groove portion connects, is not limited to the above-described examples. The groove portion may connect to a second groove portion, which is different from the groove portion.

(j) In the above-described second embodiments, the stepped surface is formed to extend toward the upper side. It is noted that, the direction, in which the stepped surface is formed, is not limited to the above-described examples. The stepped surface may be formed to extend toward the lower side. Alternatively, the stepped surface may be formed to extend in a direction inclined relative to the upper and lower direction.

(k) In the above-described embodiments, the ventilation filter is equipped to the edge of the inner opening of the ventilation throughhole. It is noted that, the position, to which the ventilation filter is equipped, is not limited to the above-described embodiments. The ventilation filter may be equipped to the ventilation throughhole.

The present disclosure relates to the electronic component accommodation member. The electronic component accommodation member includes the accommodation space formation member and the communication hole. The accommodation space formation member forms the accommodation space, which accommodates an electronic component. The communication hole communicates the accommodation space with the outside. The electronic component accommodation member further includes a ventilation member, which is equipped to the communication hole or an opening of the communication hole on the side of the accommodation space. The ventilation member is configured to permit flow of vapor between the accommodation space and the outside. The ventilation member is further configured to blockade flow of liquid between the accommodation space and the outside. The first groove portion is equipped to the outer wall of the accommodation space formation member. The first groove portion has the first groove, which communicates with the opening of the communication hole on the outside.

The ventilation member equipped to the electronic component accommodation member is configured to communicate vapor between the accommodation space and the outside. The ventilation member is further configured to restrict liquid from intruding from the outside into the accommodation space. It is noted that, when a water film is formed on the outer surface of the ventilation member, the ventilation member becomes unable to communicate vapor therethrough between the accommodation space and the outside. The electronic component accommodation member of the present disclosure is equipped with the first groove portion in the outer wall of the electronic component accommodation member. The first groove portion defines the first groove, which communicates with the opening of the communication hole located on the outside. When a water film is formed on the surface of the ventilation member located on the outside, water of the water film moves from the communication hole to the first groove of the first groove portion. Thus, the water of the water film is removed from the surface of the ventilation member. In the present configuration, the ventilation member is enabled to ventilate between the accommodation space and the outside steadily.

It should be appreciated that while the processes of the embodiments of the present disclosure have been described herein as including a specific sequence of steps, further alternative embodiments including various other sequences of these steps and/or additional steps not disclosed herein are intended to be within the steps of the present disclosure.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. An electronic component accommodation member comprising:
    an accommodation space formation member forming an accommodation space, in which an electronic component is accommodated, and a communication hole, which communicates the accommodation space with an outside; and
    a ventilation member equipped to the communication hole or an opening of the communication hole on a side of the accommodation space, the ventilation member configured to permit flow of vapor between the accommodation space and the outside and to restrict flow of liquid between the accommodation space and the outside, wherein
    the accommodation space formation member has an outer wall having a first groove portion, which forms a first groove communicating with an opening of the communication hole on an outside, the first groove portion extending to a surface of the ventilation member on the outside, wherein
    water on the surface of the ventilation member is removed through the first groove portion.

2. The electronic component accommodation member according to claim 1, wherein the first groove portion is located on a lower side relative to the communication hole.

3. The electronic component accommodation member according to claim 1, wherein the first groove has a volume larger than a volume of the communication hole.

4. The electronic component accommodation member according to claim 1, wherein
    the outer wall of the accommodation space formation member has a stepped surface, and
    the stepped surface connects to
        an end of the first groove portion, which is located on an opposite side from the communication hole, or
        a second groove portion, which forms a second groove communicating with the first groove.

5. The electronic component accommodation member according to claim 1, wherein
    the outer wall of the accommodation space formation member has a first dented portion, and
    the first dented portion connects to
        an end of the first groove portion, which is located on an opposite side from the communication hole, or
        a second groove portion, which is connected to the end of the first groove portion located on the opposite side from the communication hole.

6. The electronic component accommodation member according to claim 1, wherein the first groove includes a plurality of grooves formed radially around the communication hole.

7. The electronic component accommodation member according to claim 1, wherein
    the outer wall of the accommodation space formation member forms a second dented portion located radially outside of the communication hole, and
    the second dented portion has an inside communicating with the first groove.

8. A valve timing control device configured to control a phase of a driven shaft, which is rotatable with torque transmitted from a driving shaft of an internal combustion engine, relative to the driving shaft to control an opening-and-closing timing of a valve, which is movable in conjunction with the driven shaft, the valve timing control device comprising:
    the electronic component accommodation member according to claim 1;
    a motor accommodated in the electronic component accommodation member and configured to be supplied with electricity to generate a rotation torque;
    a motor electricity supply unit accommodated in the electronic component accommodation member and configured to control an amount of electricity supplied to the motor; and
    a phase control unit configured to transmit the rotation torque, which is generated by the motor, to the driven shaft and to control the phase of the driven shaft relative to the driving shaft according to change in a rotation speed of the motor.

9. The electronic component accommodation member according to claim 1, wherein
    the first groove portion has a bottom surface that is angled from the outside toward the surface of the ventilation member on the outside.

* * * * *